(12) United States Patent
Lutker-Lee et al.

(10) Patent No.: US 11,621,164 B2
(45) Date of Patent: Apr. 4, 2023

(54) METHOD FOR CRITICAL DIMENSION (CD) TRIM OF AN ORGANIC PATTERN USED FOR MULTI-PATTERNING PURPOSES

(71) Applicant: Tokyo Electron Limited, Tokyo (JP)

(72) Inventors: Katie Lutker-Lee, Albany, NY (US); David O'Meara, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/014,515

(22) Filed: Sep. 8, 2020

(65) Prior Publication Data
US 2022/0076942 A1  Mar. 10, 2022

(51) Int. Cl.
*H01L 21/027* (2006.01)
*H01L 21/311* (2006.01)
*H01L 21/02* (2006.01)

(52) U.S. Cl.
CPC ...... *H01L 21/0271* (2013.01); *H01L 21/0228* (2013.01); *H01L 21/31116* (2013.01)

(58) Field of Classification Search
None
See application file for complete search history.

(56) References Cited

U.S. PATENT DOCUMENTS

| 4,946,550 A * | 8/1990 | Van Laarhoven ......................... H01L 21/76819 438/631 |
| 11,037,833 B2 * | 6/2021 | Chung ............ H01L 21/823437 |
| 2016/0104613 A1 * | 4/2016 | Takeshita .......... H01L 21/02274 438/703 |

OTHER PUBLICATIONS

Raley, Angélique, et al. "A Spacer-on-Spacer Scheme for Self-Aligned Multiple Patterning and Integration." SPIE Newsroom, 2016, doi:10.1117/2.1201608.006583.
(Continued)

*Primary Examiner* — Roberts P Culbert
(74) *Attorney, Agent, or Firm* — Slater Matsil, LLP (57) ABSTRACT

Improved process flows and methods are provided herein for trimming structures formed on a patterned substrate. In the disclosed process flows and methods, a self-aligned multiple patterning (SAMP) process is utilized for patterning structures, such as mandrels, on a substrate. After the structures are patterned, an atomic layer deposition (ALD) process is used to form a spacer layer on the patterned structures. In the SAMP process disclosed herein, a critical dimension (CD) of the patterned structures is trimmed concurrently with, and as a result of, the formation of the spacer layer by controlling various ALD process parameters and conditions. By trimming the patterned structures in situ of the ALD chamber used to form the spacer layer on the patterned structures, the improved process flows and methods described herein provide a CD trim method that does not adversely affect the pattern profile or process throughput.

20 Claims, 4 Drawing Sheets

(56) References Cited

OTHER PUBLICATIONS

Kessels, Erwin. "ALD for Self-Aligned Multiple Patterning (SAxP)—How litho has become patterning and requires ALD." AtomicLimits, Mar. 13, 2017.

Dallorto, Stefano, et al. "Atomic Layer Deposition for Spacer Defined Double Patterning of Sub-10 Nm Titanium Dioxide Features." Nanotechnology, vol. 29, No. 40, 2018, p. 405302., doi:10.1088/1361-6528/aad393.

Shibata et al., "ALD-SiO2 Deposition and CD Slimming Techniques for Double Patterning and a Heater-less Batch Tool", 2010 International Symposium on Semiconductor Manufacturing (ISSM), 2010, pp. 1-3, IEEE publication Apr. 15, 2011.

\* cited by examiner

METHOD FOR CRITICAL DIMENSION (CD) TRIM OF AN ORGANIC PATTERN USED FOR MULTI-PATTERNING PURPOSES

BACKGROUND

The present disclosure relates to the processing of substrates. In particular, it provides a novel method for trimming patterns during the processing of substrates.

As geometries in substrate processing continue to shrink, the technical challenges to forming structures on substrates via photolithography techniques increase. As requirements for smaller geometry structures arose, a variety of photolithography techniques have been utilized for achieving suitable photolithography for such structures, including extreme ultraviolet (EUV) lithography, multiple patterning schemes (including self-aligned multiple patterning (SAMP) schemes such as, for example, self-aligned double patterning (SADP), self-aligned triple patterning (SATP), self-aligned quadruple patterning (SAQP), self-aligned octuple patterning (SAOP), etc.), or other small geometry patterning methods. Conventional SAMP processes may superimpose two or more multi-color pattern arrays to form the various designed structures on a substrate by selectively cutting overlapping portions of materials.

As known in the art, SAMP processes may utilize a mandrel (or core or backbone) structure having spacers formed on the sides of the mandrel to increase the structure density of the substrate surface. For example, in SADP, a mandrel may be formed on the substrate through known photolithography techniques. Mandrels may be formed of a wide variety of materials, including but not limited to, silicon, silicon nitride, hard mask materials, spin on carbon (SOC), photoresist, silicon oxide, etc. Sidewall spacers may then be formed adjacent the mandrel. The spacers may be formed from any of a wide variety of materials (such as, for example, oxides, nitrides, titanium oxide, titanium nitride etc.) through use of a conformal deposition process (including but not limited to atomic layer deposition (ALD) techniques, chemical vapor deposition (CVD) techniques, etc.) and subsequent spacer etch. At some point, a mandrel pull step may be performed to remove the originally patterned mandrel, leaving the two sidewall spacers, thus forming two structures for each mandrel.

In some SAMP processes, the mandrel structures may be trimmed prior to the sidewall spacer deposition process to reduce a critical dimension (CD) of the mandrel structures. However, the careful control of CD trimming is becoming difficult at advanced process nodes, especially in EUV multiple patterning processes. For example, known CD trimming techniques performed in situ in the etch chamber often lead to line roughness and wiggling. Another method for CD trim uses a cyclic approach of oxidation followed by a wet etch. While the latter approach reduces line roughness and wiggling, the oxidation and wet etch steps are performed in two different process tools, which decreases throughput and increases cost.

It would be desirable to provide an improved technique for trimming patterns on a substrate. More specifically, it would be desirable to provide a method for trimming patterns on a substrate that does not adversely affect the pattern profile or process throughput.

SUMMARY

Improved process flows and methods are provided herein for trimming structures formed on a patterned substrate. In the disclosed process flows and methods, a self-aligned multiple patterning (SAMP) process is utilized for patterning structures, such as mandrels, on a substrate. After the structures are patterned, an atomic layer deposition (ALD) process is used to form a spacer layer on the patterned structures. In the SAMP process disclosed herein, a critical dimension (CD) of the patterned structures is trimmed concurrently with, and as a result of, the ALD process used to form the spacer layer by controlling various ALD process parameters and conditions. By trimming the patterned structures in situ of the ALD chamber used to form the spacer layer on the patterned structures, the improved process flows and methods described herein provide a CD trim method that does not adversely affect the pattern profile or process throughput.

According to one embodiment, a method is provided for trimming patterned structures formed on a substrate using a self-aligned multiple patterning (SAMP) process. In some embodiments, the method may begin by forming a plurality of structures on the patterned substrate, the plurality of structures comprising at least mandrels. The method may further include utilizing an atomic layer deposition (ALD) process to form a spacer layer on the patterned substrate, wherein the ALD process consumes a portion of the mandrels originally formed on the patterned substrate. As a result, the ALD process reduces or trims a critical dimension (CD) of the mandrels, leaving thinner, trimmed mandrels on the patterned substrate.

In some embodiments, the mandrels originally formed on the patterned substrate may comprise an organic mask or an organic layer. In some embodiments, the mandrels originally formed on the patterned substrate may comprise an organic material, such as but not limited to, hydrocarbons, $C_xH_yN_z$ materials, fluorocarbons, or photoresist materials.

In some embodiments, the utilizing the ALD process to form the spacer layer on the patterned substrate may comprise providing the patterned substrate within an ALD chamber, and exposing the patterned substrate provided within the ALD chamber to an oxygen-containing gas. When the mandrels originally formed on the patterned substrate comprise an organic material, a reaction between the oxygen-containing gas and the organic material used to form the mandrels oxidizes exposed surfaces of the mandrels to trim the mandrels.

In some embodiments, the utilizing the ALD process to form the spacer layer on the patterned substrate may include an additional step after the patterned substrate is exposed to the oxygen-containing gas. For example, the utilizing the ALD process to form the spacer layer on the patterned substrate may further comprises exposing the patterned substrate provided within the ALD chamber to an additional precursor gas to complete a formation of the spacer layer onto oxidized exposed surfaces of the mandrels. In some embodiments, the ALD process modifies the oxidized exposed surfaces of the mandrels to form a silicon oxide, silicon nitride, titanium oxide and/or titanium nitride spacer layer on the mandrels.

In some embodiments, the method disclosed herein may further include etching the spacer layer to form two sidewall spacers on either side of each of the trimmed mandrels, and removing the trimmed mandrels, leaving the two sidewall spacers on the patterned substrate for each of the trimmed mandrels. In some embodiments, the spacer layer may be etched using a plasma etch.

According to another embodiment, a method is provided for trimming a pattern on a substrate in situ of an atomic layer deposition (ALD) chamber. In some embodiments, the method may begin by providing a patterned substrate within the ALD chamber, wherein the patterned substrate includes a plurality of structures, wherein the plurality of structures comprise at least mandrels, and wherein the mandrels are formed from an organic material. The method may further include exposing the patterned substrate provided within the ALD chamber to an ALD process, which forms a spacer layer on the exposed surfaces of the patterned substrate. The ALD process modifies exposed surfaces of the mandrels to form the spacer layer on the mandrels, and trims a critical dimension (CD) of the mandrels, leaving thinner, trimmed mandrels on the patterned substrate, while a spacer layer is also formed on the mandrels.

The ALD process may be a multi-step process or a single step process that includes the use of an oxidation gas. In a multi-step ALD process, the oxidation gas may be used in a first step of the ALD process followed by the use of a precursor gas in a second step to complete the spacer layer formation. In the multi-step ALD process, a reaction between the precursor gas and oxidized surfaces of the mandrels completes formation of the spacer layer on the mandrels. In a single step ALD process, the oxidation gas may be used in combinations with other gases to form the spacer layer in a single step.

In some embodiments, the organic material used to form the mandrels may comprise hydrocarbons, $C_xH_yN_z$ materials, fluorocarbons, or photoresist. In some embodiments, the oxidation gas used in the single-step or the multi-step ALD process may comprise ozone ($O_3$), oxygen ($O_2$), or plasma oxygen ($O_2$). In some embodiments, the precursor gas used in the multi-step ALD process may comprise a silicon, metal, or nitrogen-containing gas. In one embodiment, for example, the precursor gas may comprise silicon, titanium and/or nitrogen.

In some embodiments, the method disclosed herein may further include etching the spacer layer to form two sidewall spacers on either side of each of the trimmed mandrels, and removing the trimmed mandrels, leaving the two sidewall spacers on the patterned substrate for each of the trimmed mandrels.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Improved process flows and methods are provided herein for trimming structures formed on a patterned substrate. In the disclosed process flows and methods, a self-aligned multiple patterning (SAMP) process is utilized for patterning structures, such as mandrels, on a substrate. After the structures are patterned, an atomic layer deposition (ALD) process is used to form a spacer layer on the patterned structures. In the SAMP process disclosed herein, a critical dimension (CD) of the patterned structures is trimmed concurrently with, and as a result of, the formation of the spacer layer by controlling various ALD process parameters and conditions. By trimming the patterned structures in situ of the ALD chamber or system used to form the spacer layer on the patterned structures, the improved process flows and methods described herein provide a CD trim method that does not adversely affect the pattern profile or process throughput.

FIGS. 1A-1D illustrate one embodiment of an exemplary process flow for trimming structures formed on a patterned substrate 100 according to the techniques disclosed herein. It will be recognized that the embodiment of FIGS. 1A-1D is merely exemplary and the techniques described herein may be applied to other process flows. In the embodiment shown in FIG. 1A, the structures formed on the patterned substrate 100 include at least a plurality of mandrels 108. The mandrels 108 may generally be formed over one or more underlying layers, such as a hard mask layer 106, an etch stop layer 104, and a substrate 102. The underlying layers described, however, are merely exemplary more, less or other underlying layers may be utilized.

Figure 1A:
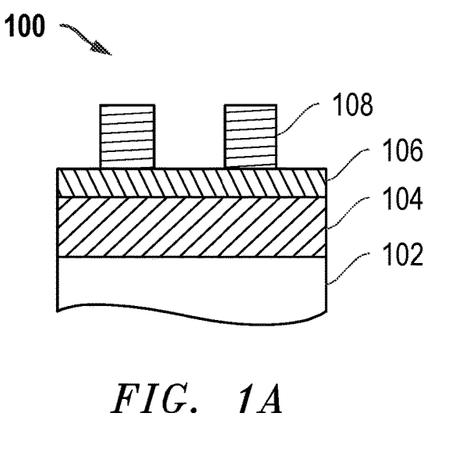
FIGS. 1A-1D illustrate an improved process for trimming patterns on a substrate.

Substrate 102 may be any substrate for which the use of patterned features is desirable. For example, in one embodiment, substrate 102 may be a semiconductor substrate having one or more semiconductor processing layers formed thereon. In one embodiment, the substrate 102 may be a substrate that has been subject to multiple semiconductor processing steps which yield a wide variety of structures and layers, all of which are known in the substrate processing art.

The hard mask layer 106 and etch stop layer 104 may be formed of any of a wide variety of materials as is known in the art. Likewise, the mandrels 108 may be formed from a wide variety of materials. In one embodiment, mandrels 108 may be an organic mask or an organic layer, such as a spin on carbon (SOC) mask, a spin on hard (SOH) mask, an organic planarization layer (OPL), an advanced patterning film (APF), an amorphous carbon layer (ACL), photoresist etc. Examples of organic materials that may be used to form mandrels 108 include, but not limited to, hydrocarbons, $C_xH_yN_z$ materials, fluorocarbons, photoresist materials, etc.

The techniques for forming mandrels 108 in a multiple patterning process are well known in the art. As known, mandrels 108 may be patterned by any of a number of photolithography or other patterning techniques. In one embodiment, mandrels 108 may be formed through a process that utilizes photolithography techniques to pattern a resist layer over a mandrel layer. A variety of photolithography techniques may be utilized to pattern the mandrel layer to form mandrels 108. Examples of photolithography techniques that may be used to form mandrels 108 include, but are not limited to, 193/193i lithography, EUV lithography, or a combination of lithography and etch steps. In some embodiments, one or more intervening layers may be used as part of the photolithography process between the mandrel layer and the resist layer, including one or more spin on glass (SOG) layers, spin on carbon (SOC) layers, antireflective coatings, etc., all as is known in the art. After patterning the mandrel layer, the mandrels 108 remain as shown in FIG. 1A. It will be recognized that the concepts disclosed herein are not limited, however, to any particular mandrel formation technique and are applicable to any techniques utilized to form the mandrels 108.

As noted above, mandrels 108 may be formed from any of a wide variety of materials. As will be understood by reference to FIG. 1B below, the material used to form the mandrels 108 is preferably one in which one or more precursor gases may be used to form a spacer layer 110 on exposed surfaces of the patterned substrate 100 including exposed surfaces of the mandrels 108. In one embodiment, the mandrels 108 may be formed from an organic material, such as SOC, SOH, OPL, and photoresist, which is reactive with oxygen-containing precursor gases. However, the mandrels 108 may be formed from other materials known for being reactive with other precursor gases. Other materials that may be used to form the mandrels 108 include, but are not limited to, silicon, silicon nitride, other known mandrel materials, etc.

Figure 1B:
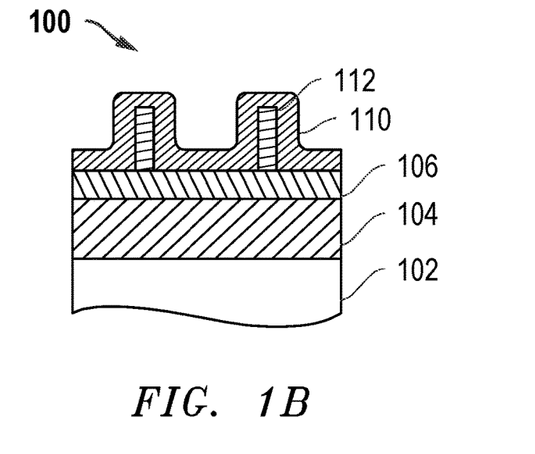

After the formation of the mandrels 108, a spacer layer 110 may be formed on the mandrels 108 as shown in FIG. 1B. The spacer layer 110 may generally be formed through the use of an atomic layer deposition (ALD) process. More specifically, the spacer layer 110 may be formed by providing the patterned substrate 100 within an ALD chamber or ALD system and exposing the patterned substrate 100 to one or more precursor gases. When the patterned substrate 100 is exposed to the one or more precursor gases, exposed surfaces of the patterned substrate are modified to form the spacer layer 110. In one embodiment, the one or more precursor gases may include an oxidant or oxygen-containing gas, such as but not limited to ozone, ($O_3$), oxygen ($O_2$), plasma oxygen ($O_2$), etc. The one or more precursor gases may further include one or more additional gases containing, for example, silicon, titanium (or other metals), nitrogen, or any other materials for which an ALD layer may be formed, or a combination thereof. The one or more precursor gases may be provided in a series of separate ALD steps or may be provided in a single ALD step.

When the organic material used to form the mandrels 108 is exposed to the one or more precursor gases, exposed surfaces of the organic material may be trimmed and modified to form the spacer layer 110 on the mandrels. This trimming and modification may occur through the use of an ALD process. The ALD process may be a multi-step process in which trimming occurs in one step of the process and then a deposition occurs in another step of the process. Alternatively, a trim and deposition may occur together in the same ALD step. For example, when the patterned substrate 100 is exposed to an oxygen-containing gas during the ALD process, the reaction between the organic material used to form the mandrels 108 and the oxygen-containing gas causes a portion of the mandrels 108 originally formed on the patterned substrate 100 to be consumed during the beginning of the spacer layer 110 formation step (shown in FIG. 1B). The reaction between the organic material and the oxygen-containing gas effectively reduces or trims a critical dimension (CD) of the originally formed mandrels 108 leaving thinner, trimmed mandrels 112.

In some embodiments, the ALD process may include a multi-step process in which the spacer layer 110 may be formed by exposing the patterned substrate 100 to an oxygen-containing gas followed by exposure to an additional precursor gas. In other embodiments, a single precursor gas which includes oxygen may be utilized. As such, the ALD process used to form the spacer layer 110 (shown in FIG. 1B) may be a single-step process or a multi-step process. In the multi-step ALD process, the surface of the patterned substrate 100 is first exposed to the oxygen-containing gas to oxidize the surface of the mandrels 108 (and thus trim the mandrels), and subsequently exposed to an additional precursor gas which completes the formation of the spacer layer 110 onto the oxidized surface of the mandrels. In the single-step ALD process, the oxygen-containing gas oxidizes the organic material used to form the mandrels 108 to trim the mandrels and form the spacer layer 110 on the surface of the mandrels in a single step.

The amount of trim achieved during the spacer formation step may be adjusted by controlling various ALD process parameters and conditions. For example, the amount of trim can be adjusted by controlling one or more ALD process parameters associated with the oxygen-containing gas (such as, e.g., the oxidant density, concentration, gas flow, exposure time, etc.) in addition to other ALD process parameters, such as the power, pressure, temperature, rotational speed, etc.

Figure 1C:
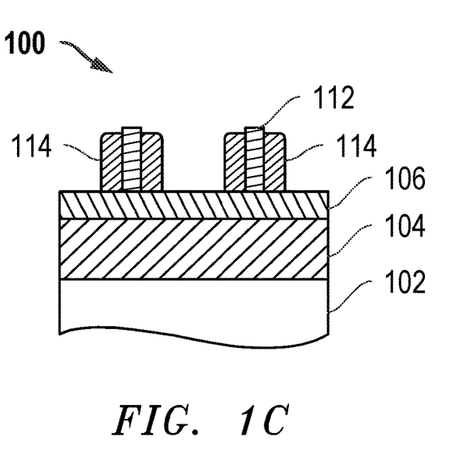

In FIG. 1C, the spacer layer 110 is etched to leave sidewall spacers 114 on either sides of the trimmed mandrels 112. The sidewall spacers 114 may be formed using any of a wide variety of etch techniques, including but not limited to, plasma etch chemistries. The plasma etch chemistries used to etch the spacer layer 110 and form sidewall spacers 114 may generally depend on the spacer layer 110 material formed or deposited onto the patterned substrate 100 during the spacer formation step (shown in FIG. 1B). In some embodiments, the spacer layer 110 material may comprise silicon dioxide, silicon nitride, titanium oxide, or titanium nitride, for example. In such embodiments, plasma etch chemistries suitable for etching the spacer layer 110 and forming the sidewall spacers 114 may include, but are not limited to, $Cl_2$, $BCl_3$, $NF_3$, $CF_xH_y$, $SF_6$, $C_xF_y$, $O_2$, $N_2$, Ar, He, etc. Other plasma etch chemistries may be used to etch other spacer layer materials, as is known in the art.

Figure 1D:
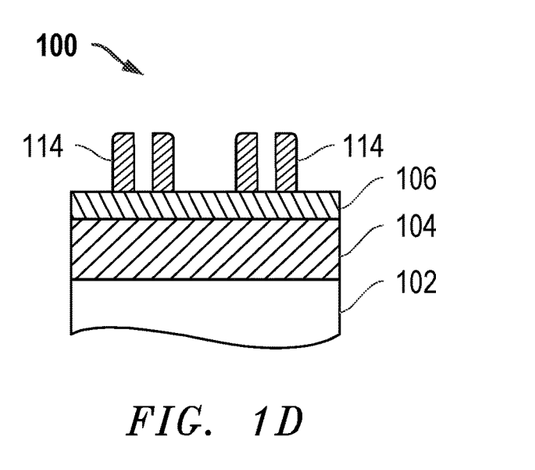

In FIG. 1D, the trimmed mandrels 112 are removed via another etch process commonly referred to as a mandrel pull step. In the mandrel pull step shown in FIG. 1D, the trimmed mandrels 112 are removed, leaving two sidewall spacers 114 on the patterned substrate 100 for each mandrel. The trimmed mandrels 112 may be removed using any of a wide variety of etch techniques, including but not limited to, plasma etch wet etch, and ash techniques. The mandrel pull step (shown in FIG. 1D) may be performed in the same or different chamber as the spacer etch step (shown in FIG. 1C). In some embodiments, the etch process used to remove the trimmed mandrels 112 may preferably demonstrate selectivity between the material of the sidewall spacers 114 (e.g., silicon oxide, silicon nitride, titanium oxide, or titanium nitride) and the organic material used to form the mandrels 108 (e.g., SOC, SOH, OPL, photoresist, etc.). When the mandrels 108 are formed from organic materials, for example, the etch process used to remove the trimmed mandrels 112 may utilize a wide variety of etch chemistries, including but not limited to, $O_2$, $N_2$, $H_2$, $CO_2$, CO, Ar, He, etc. and combinations of.

In some embodiments, one or more downstream processing steps may be performed after the mandrel pull step shown in FIG. 1D. For example, the pattern formed by the sidewall spacers 114 may be transferred to the hard mask layer 106 by subjecting the patterned substrate 100 to another etch process, which etches the hard mask layer 106 selectively to the sidewall spacers 114. The sidewall spacers 114 may then be removed via another etch or strip step to leave patterned hard mask structures (not shown) on the substrate 102.

The process flow shown in FIGS. 1A-1D is one example of a SAMP process that may be used to trim a critical dimension (CD) of a patterned structure (such as a mandrel) concurrently with forming a spacer layer on the patterned structure. Although described above in the context of a SADP process flow, the ALD CD trimming techniques described herein may be utilized in a variety of SAMP process flows including SADP, SAQP, SAOP, etc. process flows.

In the process flow shown in FIGS. 1A-1D, a mandrel material and a spacer material are formed on a variety of underlying layers and materials, such as but not limited to, a hard mask layer 106, an etch stop layer 104, and a substrate 102. The hard mask layer 106, etch stop layer 104 and substrate 102 may be formed of any of a wide variety of materials as is known in the art. Exemplary mandrel materials include, but are not limited to, SOC, SOH, OPL, photoresist, silicon and silicon nitride. Exemplary spacer layer materials include, but are not limited to, silicon dioxide, silicon nitride, titanium oxide and titanium nitride. It will be recognized by those skilled in the art that the particular materials used and described in the figures are merely exemplary, and a wide range of materials may be utilized depending upon the particular process flow for which the ALD CD trimming techniques disclosed herein are being utilized.

As described herein, patterned structures (such as mandrels 108) are trimmed during a spacer layer formation step of a self-aligned multiple patterning (SAMP) process. In the disclosed embodiments, an atomic layer deposition (ALD) process is used to form the spacer layer on, and simultaneously trim, the patterned structures. By trimming the patterned structures in situ of the ALD chamber or ALD system during the spacer layer formation step, the SAMP process described herein provides a novel CD trimming method that does not adversely affect the pattern profile or process throughput.

After the spacer layer is formed and the patterned structures are trimmed, various etch steps may be performed for etching the spacer layer and removing the trimmed structures (e.g., trimmed mandrels). As used herein, the etch steps may be any of a wide variety of techniques known to remove material from a substrate. For example, the etch steps may include, but are not limited to, dry etch techniques (in one exemplary embodiment, plasma etch techniques), wet etch techniques, other removal techniques, and/or a combination of such techniques.

In one exemplary embodiment, the spacer layer 110 may comprise titanium oxide and the trimmed mandrels 112 may comprise photoresist. In such an embodiment, the spacer etch utilized to achieve the sidewall spacers 114 shown in FIG. 1C may be a plasma etch based on $Cl_2$, $BCl_3$, $CF_xH_y$, $C_xF_y$, Ar, He, $N_2$ etc. chemistries. Likewise, a plasma etch based on $O_2$, $N_2$, $H_2$, $CO_2$, CO, Ar, He, etc. (and combinations of) chemistries may be used to achieve the mandrel pull step shown in FIG. 1D.

Figure 2:
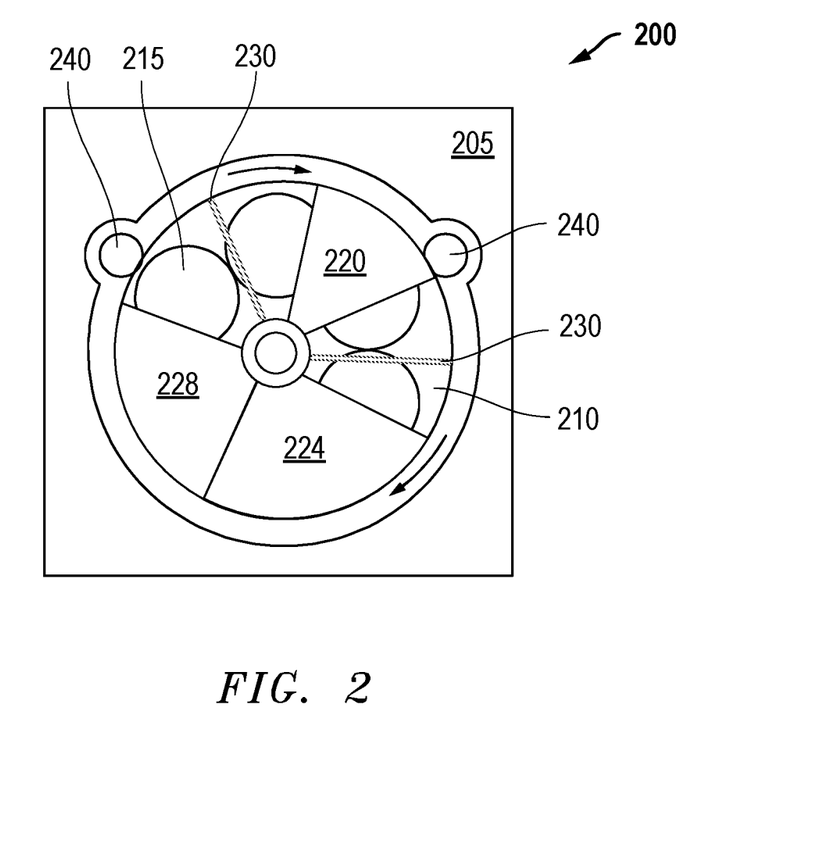
FIG. 2 is a block diagram illustrating one embodiment of an atomic layer deposition (ALD) system that may be used to perform the techniques described herein.

FIG. 2 illustrates one example of an ALD system that may be used to perform the techniques described herein. As shown in FIG. 2, one embodiment is depicted of a spatial ALD system 200 that may be used to concurrently trim patterned structures during an ALD process. It is recognized, however, that the system shown in FIG. 2 is merely one example system in which the techniques described herein may be utilized. Other ALD systems may also be used to perform the techniques described herein.

FIG. 2 provides a top-down view of a spatial ALD system 200 as seen inside a process chamber 205 of the spatial ALD system 200. As shown in FIG. 2, a rotating platen 210 is provided within the process chamber 205 for holding one or more substrates 215. Each of the substrates 215 may be arranged on a susceptor (not shown), which supplies heat to the substrate. A number of processing sections and purge sources may also be provided within the process chamber 205 and located above the rotating platen 210 for providing various gases to the substrate. Gas outlet pumping ports 240 may also be provided.

In the example embodiment shown in FIG. 2, spatial ALD system 200 includes three process sections: an oxidation section 224, a precursor section 220 and a plasma treatment section 228. Either or both of oxidation section 224 and/or plasma treatment section 228 can be used for oxidation reduction of the mandrel by O2, O3 or plasma O2, or oxygen containing gases. The precursor gas can be delayed in flowing to the substrates until the desired mandrel erosion is achieved, then the precursor may be turned on to start the spacer deposition, which stops further mandrel erosion. The oxidation section 224, precursor section 220 and plasma treatment section 228 are separated by inert gas areas, where the inert gas is introduced by purge sources 230. The inert gases injected by purge sources 230 and the separate exhaust configuration provided by gas outlet pumping ports 240 enable fast rotation speeds of the system without detrimental effects of gas mixing.

Some embodiments of the ALD trim process may utilize one, two or all three process sections. In some embodiments, for example, the ALD trim process may use the oxidation section 224 to oxidize a surface of the mandrels (and thus, trim the mandrels) as part of the ALD process by first exposing the surface of the patterned substrate to an oxygen-containing gas (e.g., oxygen, ozone, etc.), and then use the precursor section 220 to complete the spacer layer formation by exposing the surface of the patterned substrate to an additional precursor gas (e.g., a silicon, nitrogen or titanium containing gas). In still other embodiments, the trimming of the mandrels and formation of the spacer layer may all occur through the use of a single step in the precursor section 220 in a process in which the precursor gas contains both oxygen and other materials so that the mandrel is trimmed and the spacer layer is formed all in a single step.

As the rotating platen 210 rotates (as indicated by the arrows), the one or more of substrates 215 are moved in sequence under the oxidation section 224, the precursor section 220 and the plasma treatment section 228 to perform one or more cycles of the ALD trim process described herein. Purge sources 230 provide a gas purge (e.g., an argon, nitrogen, or other inert gas purge) after the substrates 215 rotate past the oxidation section 224 and the plasma treatment section 228 to prevent gas mixing. Although not shown in FIG. 2, a controller may be provided for controlling various operating parameters of the spatial ALD system 200 including, for example, gas flows, pressures, temperatures, rotation speeds, number of cycles, etc. Moreover, sensors may also be utilized in conjunction with the controller to monitor the amount of mandrel erosion to provide in situ process control of the trimming. For example, a sensor may monitor the carbon content of the effluent to determine the amount of mandrel erosion. In one embodiment, the sensor monitoring the effluent may be a residual gas analyzer (RGA). Other sensing techniques, however, may also be utilized to provide in situ control of the trimming.

Figure 3:
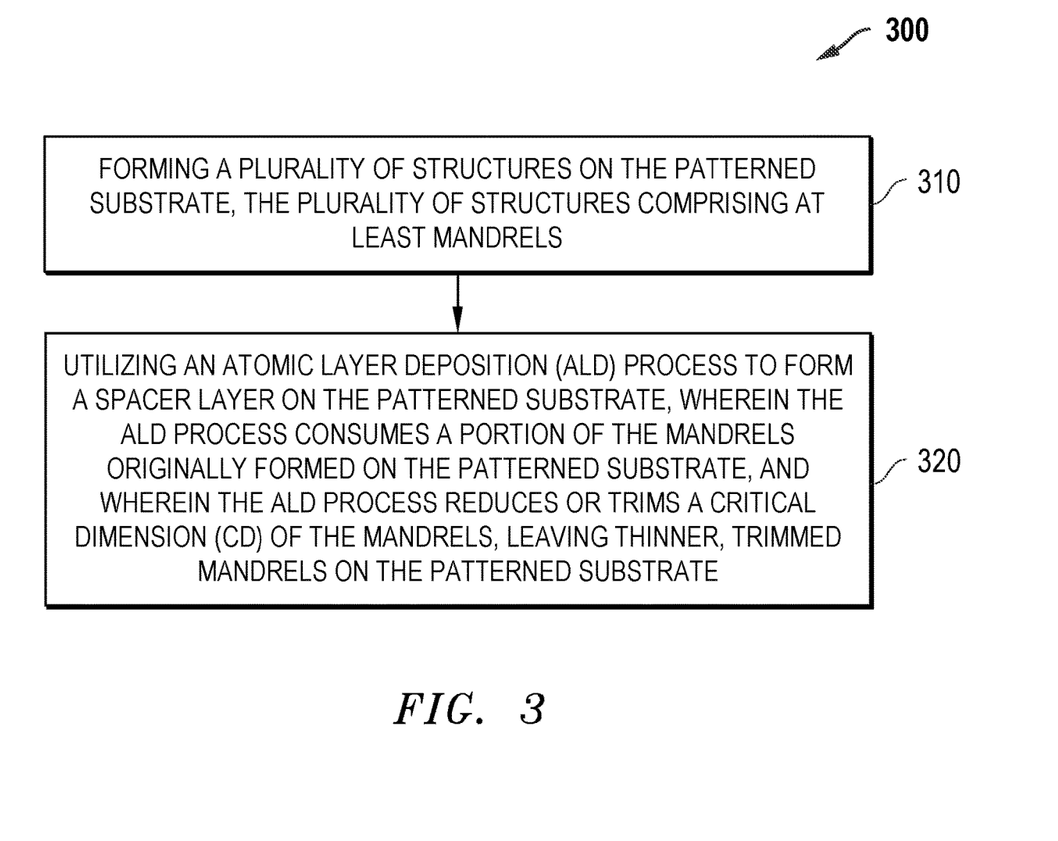
FIGS. 3 and 4 illustrate exemplary methods for using the techniques described herein.
Figure 4:
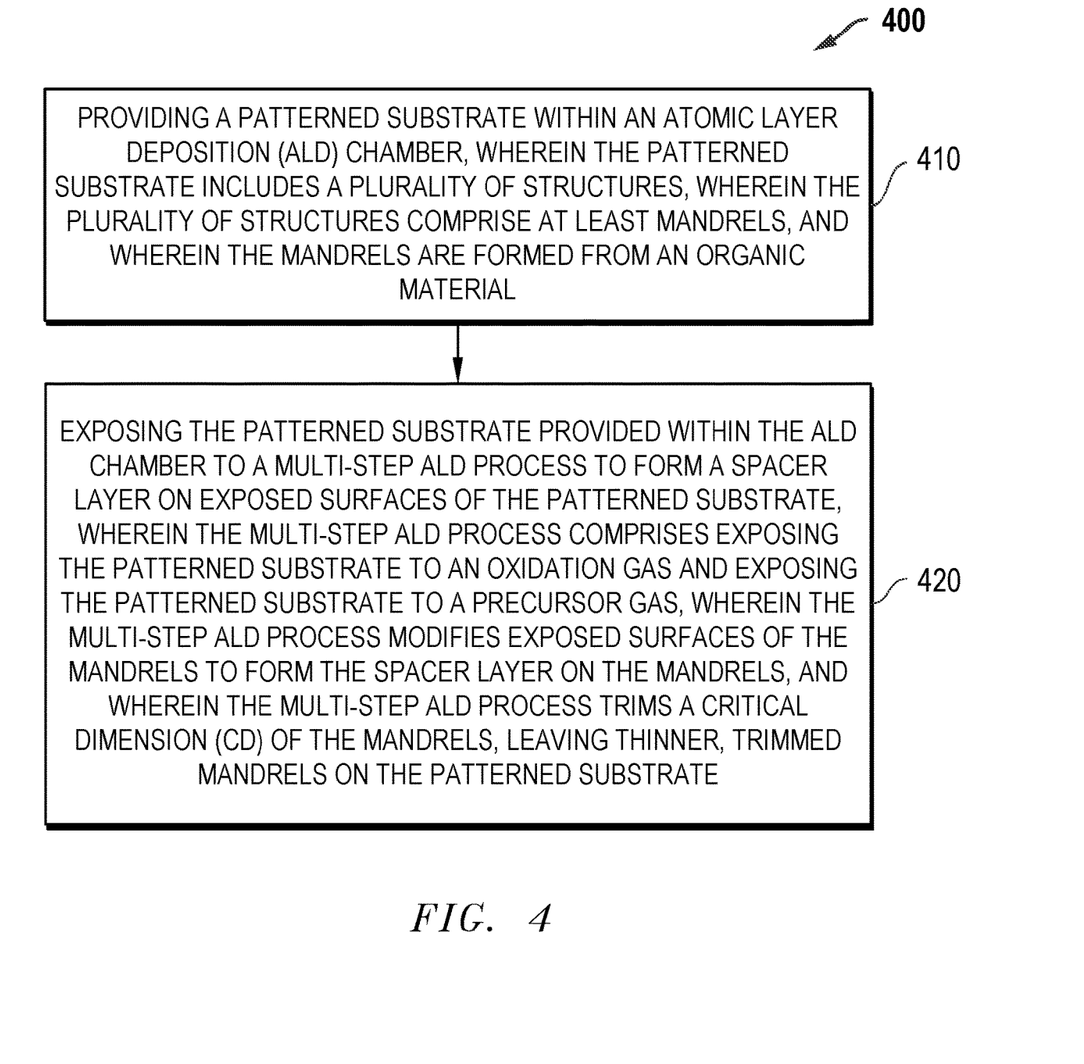

FIGS. 3-4 illustrate exemplary methods for use of the processing techniques described herein. It will be recognized that the embodiments of FIGS. 3-4 are merely exemplary and additional methods may utilize the techniques described herein. Further, additional processing steps may be added to the methods shown in the FIGS. 3-4 as the steps described are not intended to be exclusive. Moreover, the order of the steps is not limited to the order shown in the figures as different orders may occur and/or various steps may be performed in combination or at the same time.

FIG. 3 illustrates one embodiment of a method 300 of trimming structures formed on a patterned substrate using a self-aligned multiple patterning (SAMP) process. In the illustrated embodiment, the method 300 includes forming a plurality of structures on the patterned substrate, the plurality of structures comprising at least mandrels (in step 310). In step 320, method 300 includes utilizing an atomic layer deposition (ALD) process to form a spacer layer on the patterned substrate, wherein the ALD process consumes a portion of the mandrels originally formed on the patterned substrate. As a result, the ALD process reduces or trims a critical dimension (CD) of the mandrels, leaving thinner, trimmed mandrels on the patterned substrate.

FIG. 4 illustrates a method 400 of trimming a pattern on a substrate in situ of an atomic layer deposition (ALD) chamber. In the illustrated embodiment, the method 400 includes providing a patterned substrate within the ALD chamber, wherein the patterned substrate includes a plurality of structures, wherein the plurality of structures comprise at least mandrels, and wherein the mandrels are formed from an organic material. The method 400 further includes exposing the patterned substrate provided within the ALD chamber to a multi-step ALD process to form a spacer layer on exposed surfaces of the patterned substrate (in step 420). The multi-step ALD process utilized in step 420 exposes the patterned substrate to an oxidation gas and exposes the patterned substrate to a precursor gas. In the method 400 shown in FIG. 4, the multi-step ALD process modifies exposed surfaces of the mandrels to form the spacer layer on the mandrels, and trims a critical dimension (CD) of the mandrels, leaving thinner, trimmed mandrels on the patterned substrate.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of trimming a pattern on a patterned substrate in situ of an atomic layer deposition (ALD) chamber, comprising:
   providing a patterned substrate within the ALD chamber, wherein the patterned substrate includes a plurality of structures, wherein the plurality of structures comprise at least mandrels, and wherein the mandrels are formed from an organic material;
   exposing the patterned substrate provided within the ALD chamber to a multi-step ALD process to form a spacer layer on exposed surfaces of the patterned substrate, wherein the multi-step ALD process comprises
      a trimming step of exposing the patterned substrate to an oxidation gas in the absence of a plasma,
      a deposition step of exposing the patterned substrate to a precursor gas, and
      alternating the trimming step and the deposition step,
   wherein the multi-step ALD process, during the trimming step, modifies exposed surfaces of the mandrels through a reaction between the organic material and the oxidation gas;
   wherein the multi-step ALD process, during the trimming step, trims a critical dimension (CD) of the mandrels by consumption of a portion of the mandrel during the reaction, leaving thinner, trimmed mandrels on the patterned substrate; and
   wherein the multi-step ALD process, during the deposition step, forms the spacer layer by deposition on the trimmed mandrels.

2. The method of claim 1, wherein the organic material comprises hydrocarbons, CxHyNz materials, fluorocarbons, or photoresist.

3. The method of claim 1, wherein the oxidation gas comprises ozone ($O_3$), or oxygen ($O_2$).

4. The method of claim 1, wherein the precursor gas comprises a titanium, or nitrogen-containing gas.

5. The method of claim 1, further comprising:
   etching the spacer layer to form two sidewall spacers on either side of each of the trimmed mandrels; and
   removing the trimmed mandrels, leaving the two sidewall spacers on the patterned substrate for each of the trimmed mandrels.

6. The method of claim 5, wherein a reaction between the precursor gas and oxidized surfaces of the mandrels completes formation of the spacer layer on the mandrels.

7. The method of claim 1, further comprising in-situ monitoring an amount of the trimming of the CD.

8. The method of claim 7, wherein the in-situ monitoring is performed by using a sensor to monitor a carbon content in a gas phase.

9. The method of claim 1, further comprising exposing the patterned substrate provided to an additional precursor gas to complete the formation of the spacer layer on the trimmed mandrels.

10. The method of claim 1, wherein the multi-step ALD process further comprises a plasma step of exposing the patterned substrate to a plasma.

11. The method of claim 1, wherein the spacer layer comprises silicon oxide, or silicon nitride.

12. The method of claim 1, wherein the trimming step and the deposition step overlap in time.

13. The method of claim 1, wherein the trimming step and the deposition step are performed simultaneously.

14. The method of claim 1, wherein the spacer layer comprises titanium oxide, or titanium nitride.

15. A method of trimming a pattern on a patterned substrate in situ of an atomic layer deposition (ALD) chamber, comprising:
   providing a patterned substrate within the ALD chamber, wherein the patterned substrate includes a plurality of structures, wherein the plurality of structures comprise at least mandrels, and wherein the mandrels are formed from an organic material, the ALD chamber being a spatial ALD system;
   performing a multi-step ALD process to form a spacer layer on exposed surfaces of the patterned substrate, the multi-step ALD process comprising:
      exposing the patterned substrate to an oxidation gas in a first section of the spatial ALD system in the absence of a plasma to oxidize exposed surfaces of the mandrels; and
      exposing the patterned substrate to a precursor gas in a second section of the spatial ALD system.

16. The method of claim 15, wherein the multi-step ALD process further comprises exposing the patterned substrate to a plasma in a third section of the spatial ALD system.

17. The method of claim 16, further comprising reducing the critical dimensions of the mandrels by exposing the patterned substrate to the oxidation gas and the plasma, and wherein the precursor gas is introduced to the third section after reducing the critical dimensions of the mandrels.

18. The method of claim 16, further comprising reducing the critical dimensions of the mandrels in the first, the second, and third sections.

19. A method of trimming a pattern on a patterned substrate in situ of an atomic layer deposition (ALD) chamber, comprising:
- providing a patterned substrate within the ALD chamber, wherein the patterned substrate includes a plurality of structures, wherein the plurality of structures comprise at least mandrels, and wherein the mandrels are formed from an organic material;
- exposing the patterned substrate provided within the ALD chamber to a multi-step ALD process to form a spacer layer on exposed surfaces of the patterned substrate, wherein the multi-step ALD process comprises
  - a trimming step of exposing the patterned substrate to an oxidation gas in the absence of a plasma, and
  - a deposition step of exposing the patterned substrate to a precursor gas,
- wherein the multi-step ALD process, during the trimming step, modifies exposed surfaces of the mandrels through a reaction between the organic material and the oxidation gas;
- wherein the multi-step ALD process, during the trimming step, trims a critical dimension (CD) of the mandrels by consumption of a portion of the mandrel during the reaction, leaving thinner, trimmed mandrels on the patterned substrate; and
- wherein the multi-step ALD process, during the deposition step, forms the spacer layer by deposition on the trimmed mandrels.

20. The method of claim 19, wherein the multi-step ALD process further comprises:
- a plasma step of exposing the patterned substrate to a plasma, and
- repeating the trimming step, the plasma step, and the deposition step.

* * * * *